United States Patent [19]
Yoshii et al.

[11] Patent Number: 5,682,059
[45] Date of Patent: Oct. 28, 1997

[54] SEMICONDUCTOR DEVICE INCLUDING ANTI-FUSE ELEMENT AND METHOD OF MANUFACTURING THE DEVICE

[75] Inventors: Ichiro Yoshii; Mariko Takagi, both of Kawasaki, Japan

[73] Assignee: Kabushiki Kaisha Toshiba, Tokyo, Japan

[21] Appl. No.: 712,156

[22] Filed: Sep. 12, 1996

Related U.S. Application Data

[63] Continuation of Ser. No. 377,312, Jan. 24, 1995, abandoned.

[30] Foreign Application Priority Data

Jan. 24, 1994 [JP] Japan .................. 6-005790

[51] Int. Cl.⁶ .................................................. H01L 29/00
[52] U.S. Cl. ........................................................... 257/530
[58] Field of Search .................................. 257/530, 209, 257/50; 437/922

[56] References Cited

U.S. PATENT DOCUMENTS

| | | |
|---|---|---|
| 4,823,181 | 4/1989 | Mohsen et al. |
| 5,171,715 | 12/1992 | Husher et al. |
| 5,233,206 | 8/1993 | Lee et al. .................. 257/530 |
| 5,250,464 | 10/1993 | Wong et al. ................ 257/530 |
| 5,308,795 | 5/1994 | Hawley et al. ............. 257/530 |
| 5,331,196 | 7/1994 | Lowrey et al. ............. 257/529 |

OTHER PUBLICATIONS

Kueing-Long Chen et al., "A Sublithographic Antifuse Structure for Field-Programmable Gate Array Applications", *IEEE Electron Device Letters*, vol. 13, No. 1 (Jan. 1992) pp. 53-55.

Steve Chiang, et al., "Antifuse Structure Comparison for Field Programmable Gate Arrays", IEEE, 1992, pp. 611-614, no month.

*Primary Examiner*—J. Carroll
*Attorney, Agent, or Firm*—Loeb & Loeb LLP

[57] ABSTRACT

In a semiconductor device including an anti-fuse element, a first electrode layer is formed on a semiconductor substrate. A first insulating layer is formed only on the first electrode layer for insulating the first electrode layer. An anti-fuse insulating film is coated on at least one side wall portion of each of the first electrode layer and the first insulating layer. A second electrode layer is formed on the anti-fuse insulating film, and the first and second electrode layers and the anti-fuse insulating film constitute the anti-fuse element.

17 Claims, 3 Drawing Sheets

SEMICONDUCTOR DEVICE INCLUDING ANTI-FUSE ELEMENT AND METHOD OF MANUFACTURING THE DEVICE

This is a continuation of application Ser. No. 08/377,312, filed Jan. 24, 1995, now abandoned.

BACKGROUND OF THE INVENTION

1. Field of the Invention

This invention relates to an improvement of an anti-fuse element, and more particularly, to a semiconductor device of low capacitance including an anti-fuse element and suitable for high integration.

2. Description of the Related Art

An anti-fuse element is a switch element which can be irreversibly shifted from an electrically non-conductive state to a conductive state by an electrical method or other physical methods. The anti-fuse element is mainly used in an EPROM (Electrically Programmable Memory) or an FPGA (Field Programmable Gate Array).

In general, an anti-fuse element is formed between two wire layers, and then programmed by selectively applying high voltage therebetween such that it is shifted from a non-conductive state to a conductive state, thereby electrically connecting the wire layers to each other.

In light of this, the anti-fuse element, which is employed in a large capacity EPROM or FPGA operable at high speed, must have a sufficiently low resistance after the programming, a sufficiently small capacitance before the programming, and a sufficiently small size.

Referring to FIGS. 1–4, a semiconductor device including a conventional anti-fuse element will be explained. FIG. 1 shows a first example of the anti-fuse element. As is shown in FIG. 1, the anti-fuse element comprises a highly doped diffusion layer 103 formed on a semiconductor substrate 101, an anti-fuse insulating film 104 formed on the diffusion layer 103, and an electrode layer 105 formed on the film 104 (see U.S. Pat. No. 4,823,181).

The above structure has the following drawbacks:

First, it inevitably has a high resistance (typically about 500 Ω, and occasionally about several K Ω) after the programming due to the parasitic resistance of the diffusion layer 103. This makes it difficult to apply the anti-fuse element to the FPGA which must operate at high speed.

Second, it is extremely difficult to make the size of the anti-fuse element smaller than a predetermined value since the size of the element region is determined by a LOCOS oxide film 102. This is disadvantageous in integration of elements.

FIG. 2 shows a second example of the conventional anti-fuse element. As is shown in FIG. 2, the element comprises a first electrode layer 107 formed on the semiconductor substrate 101 with an insulating film 106 interposed therebetween, the anti-fuse insulating film 104 formed on the first electrode layer 107, and a second electrode layer 110 formed on the anti-fuse insulating film 104. The first and second electrode layers are metal layers (see '92 IEDM Technical Digest, pp. 611–614). It is known that this structure enables the electrode layers to have significantly low resistance even after programming. However, since an interlayer insulating film 108 formed on the first electrode layer 107 is thick, it is necessary to form a contact hole 109 in the interlayer insulating film 108. This being so, the size of the anti-fuse element is limited by the width of the hole, and cannot be set equal to or less than a minimum value determined in a lithography process.

Moreover, masking is necessary to form the contact hole 109 in the insulating film 108, which requires the lithography process.

FIG. 3 shows a third example of the anti-fuse element. As is shown in FIG. 3, the anti-fuse element comprises a side wall portion of the electrode layer 107, that portion of the anti-fuse insulating film 104 which is formed on the side wall portion of the layer 107, and that portion of the second electrode layer 110 which is opposed to the side wall portion of the layer 107 via the anti-fuse insulating film 104 (see U.S. Pat. No. 5,171,715). Since the anti-fuse element is formed parallel to the surface of the semiconductor substrate 101, it can have a small area. Since, however, the first electrode layer 107 and the interlayer insulating film 108 on the layer 107 are formed thick, a contact hole 109 must be formed in that portion of the film 108 which is placed on the layer 107, and also in the layer 107. Therefore, as in the case of the second example, patterning is necessary to form the hole 109. For the patterning, it is necessary to make the first and second electrode layers 107 and 110 have sufficient widths in consideration of the occurrence of misalignment in masking. As a result, it is difficult to considerably increase the degree of integration of elements.

The third example of the anti-fuse element will be explained in more detail with reference to its plan view of FIG. 4. The first and second electrode layers 107 and 110 are formed in a matrix, and the anti-fuse element is formed at an edge portion (indicated by the thick line) of each contact hole 109. This clarifies that the size of the anti-fuse element is determined in a lithography process, and hence that it is difficult to produce a highly integrated FPGA capable of high-speed operation.

In light of the above, there has been a demand for improving the semiconductor device with the conventional anti-fuse element and the method for manufacturing the device.

SUMMARY OF THE INVENTION

It is an object of the invention to provide a semiconductor device including an anti-fuse element, in which the anti-fuse element does not surround each contact hole in electrode layers, but is present on at least one side wall portion of an electrode layer, thereby reducing the width of each electrode layer and making the semiconductor device suitable for high integration.

It is another object of the invention to provide a method for manufacturing a semiconductor device including an anti-fuse element, which is suitable to high integration, by forming first and second electrode layer lines in a matrix with the use of an RIE method such that the value of distance between each adjacent pair of the electrode layers is smaller than the value of the width of a contact hole formed in the conventional lithography process.

According to a first aspect of the invention, there is provided a semiconductor device including an anti-fuse element, comprising:

a semiconductor substrate;

a first electrode layer formed on the semiconductor substrate;

a first insulating layer formed only on the first electrode layer for insulating the first electrode layer;

an anti-fuse insulating film covering at least one side wall portion of each of the first electrode layer and the first insulating layer; and a second electrode layer formed on the anti-fuse insulating film, the first and second electrode layers and the anti-fuse insulating film constituting the anti-fuse element.

According to a second aspect of the invention, there is provided a semiconductor device including anti-fuse elements, comprising:

a semiconductor substrate;

a first electrode layer group including a plurality of first electrode layers arranged in columns on the semiconductor substrate;

a first insulating layer formed only on each of the first electrode layers for insulating the first electrode layers;

an anti-fuse insulating film covering the entire surface of a resultant structure including upper portions of the first insulating layers, side wall portions of the first electrode layers and the first insulating layers; and a second electrode layer group including a plurality of second electrode layers arranged in rows on the anti-fuse insulating film, the second electrode layer group and the first electrode layer group being arranged in a matrix, the first and second electrode layers and the anti-fuse insulating film constituting the anti-fuse elements.

According to a third aspect of the invention, there is provided a semiconductor device including anti-fuse elements, comprising:

a semiconductor substrate;

a first electrode layer group including a plurality of first electrode layers arranged in columns on the semiconductor substrate;

a first insulating layer formed only on each of the first electrode layers for insulating the first electrode layers;

an anti-fuse insulating film covering the entire surface of a resultant structure including upper portions of the first insulating layers, side wall portions of the first electrode layers and the first insulating layers;

a second electrode layer group including a plurality of second electrode layers arranged in rows on the anti-fuse insulating film, the second electrode layers constituting a pair of anti-fuse elements at opposed side wall portions of each adjacent pair of the first electrode layers, each of the anti-fuse elements including a corresponding one of the first electrode layers, the anti-fuse insulating film and a corresponding one of the second electrode layers, the first electrode layer group and the second electrode layer group being arranged in a matrix;

a second insulating layer formed on the anti-fuse insulating film for insulating the second electrode layer group; and a third electrode layer group including a plurality of third electrode layers arranged in rows on the second insulating layer and the second electrode layers.

According to a fourth aspect of the invention, there is provided a method for manufacturing a semiconductor device including an anti-fuse element, comprising the steps of:

forming a first metal layer on a semiconductor substrate with an oxide film interposed therebetween;

forming a first insulating film on the first metal layer;

selectively etching the first metal layer and the first insulating film, thereby forming a first electrode layer;

coating at least one side wall portion of the first electrode layer with an anti-fuse insulating film; and forming a second electrode layer on the anti-fuse insulating film, the first and second electrode layers and the anti-fuse insulating film constituting the anti-fuse element.

According to a fifth aspect of the invention, there is provided a method for manufacturing a semiconductor device including anti-fuse elements, comprising the steps of:

forming on a semiconductor substrate a first electrode layer group including a plurality of first electrode layers arranged in columns;

forming a first insulating layer only on each of the first electrode layers for insulating the first electrode layers;

coating an anti-fuse insulating film on the entire surface of a resultant structure including upper portions of the first insulating layers, side wall portions the first electrode layers and the first insulating layers; and forming on the anti-fuse insulating film a second electrode layer group including a plurality of second electrode layers arranged in rows, such that the second electrode layer group and the first electrode layer group are arranged in a matrix, and the first and second electrode layers and the anti-fuse insulating film constitute the anti-fuse elements.

According to a sixth aspect of the invention, there is provided a method for manufacturing a semiconductor device including anti-fuse elements, comprising the steps of:

forming on a semiconductor substrate a first electrode layer group including a plurality of first electrode layers arranged in columns;

forming a first insulating layer only on each of the first electrode layers for insulating the first electrode layers;

coating an anti-fuse insulating film on the entire surface of a resultant structure including upper portions of the first insulating layers, side wall portions of the first electrode layers and the first insulating layers;

forming on the anti-fuse insulating film a second electrode layer group including a plurality of second electrode layers arranged in rows, the second electrode layers including a pair of anti-fuse elements at opposed side wall portions of each adjacent pair of the first electrode layers, each of the anti-fuse elements including a corresponding one of the first electrode layers, the anti-fuse insulating film and a corresponding one of the second electrode layers, the first electrode layer group and the second electrode layer group being arranged in a matrix;

forming a second insulating layer on the anti-fuse insulating film for insulating the second electrode layer group; and forming on the second insulating layer and the second electrode layers a third electrode layer group including a plurality of third electrode layers arranged in rows.

Since in the above-described semiconductor device including the anti-fuse element, the anti-fuse element is constituted by the first and second electrode layers and the anti-fuse insulating film at a side wall portion of the first electrode layer, the electrode layer itself can have a narrow width, and hence the semiconductor device which includes the anti-fuse element can be made suitable to high integration.

Further, since in the method for manufacturing the semiconductor including the anti-fuse element, a lithography process can be omitted, and patterning of a contact hole is not necessary, the degree of integration can be significantly increased. Thus, a low-capacity semiconductor device suitable to high integration can be manufactured.

In addition, since in the method for manufacturing the semiconductor including the anti-fuse element, the anti-fuse element can be formed without a fine treatment such as the forming of a hole in the first electrode layer, the distance between the electrode layers can easily be set in a self-alignment manner.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The embodiments of the invention will be explained with reference to the accompanying drawings.

Figure 1:
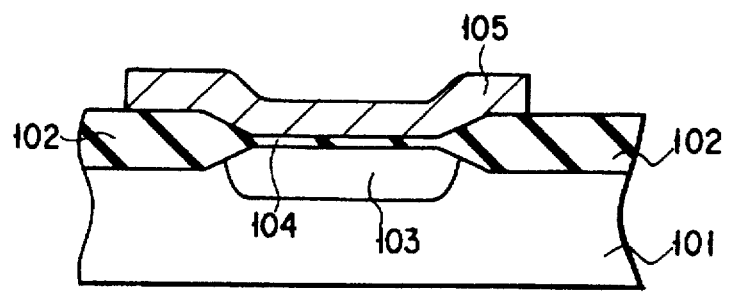
FIG. 1 is a cross sectional view, showing an essential part of an example of a conventional anti-fuse element.
Figure 2:
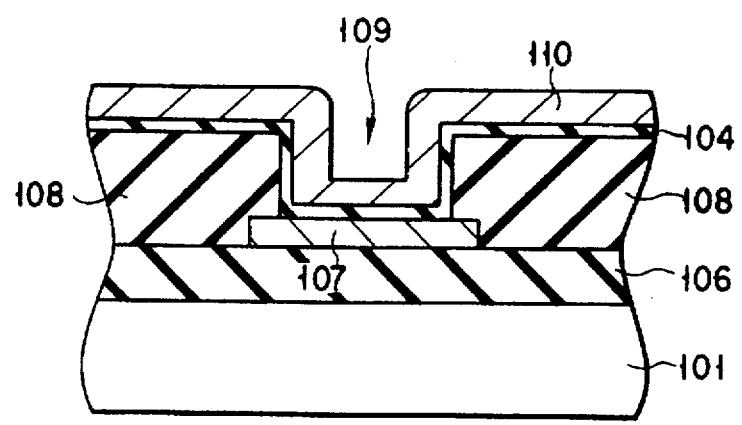
FIG. 2 is a cross-sectional view, showing an essential part of another example of the conventional anti-fuse element.
Figure 3:
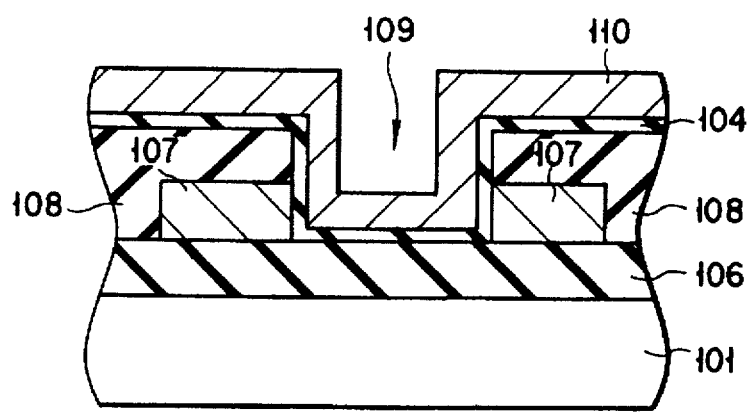
FIG. 3 is a cross-sectional view, showing an essential part of a further example of the conventional anti-fuse element.
Figure 4:
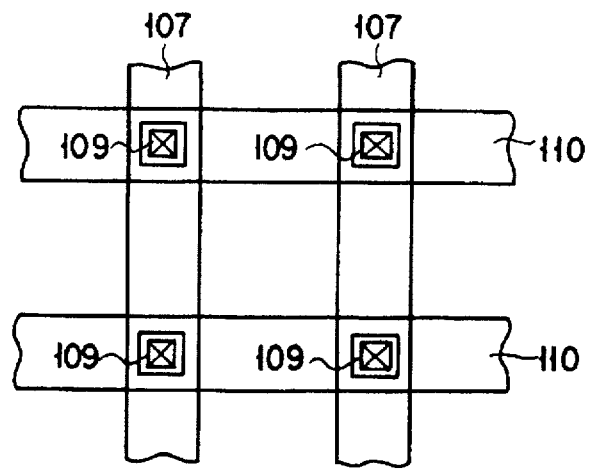
FIG. 4 is a schematic plan view, showing the conventional anti-fuse element of FIG. 3.
Figure 5:
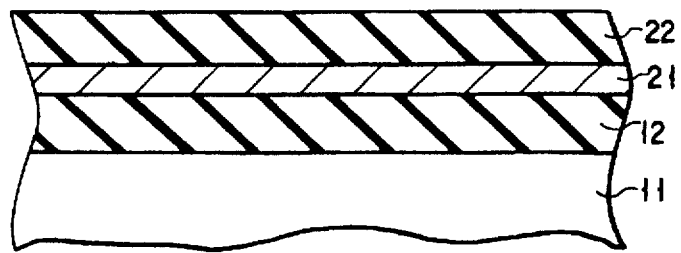
FIG. 5 is a cross sectional view, useful in explaining a process step for forming an anti-fuse element according to the present invention.

As is shown in FIG. 5, after forming an oxide film 12 on a silicon substrate 11, a first metal layer 21 made of an Al alloy (Al/Si/Cu) and having a thickness of about 1000Å is formed on the oxide film 12 by sputtering.

Then, a first insulating film 22, such as a silicon oxide film, having a thickness of about 3000Å is deposited by the plasma CVD method, or the like.

Figure 6:
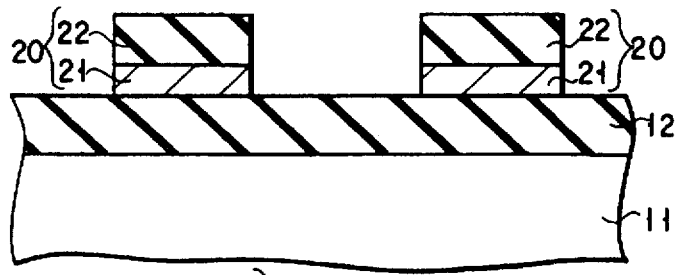
FIG. 6 is a cross sectional view, useful in explaining a process step subsequent to that of FIG. 5.

Subsequently, as is shown in FIG. 6, the first metal layer 21 and the first insulating film 22 are selectively etched by the RIE method, thereby forming a first electrode layer 20.

Figure 7:
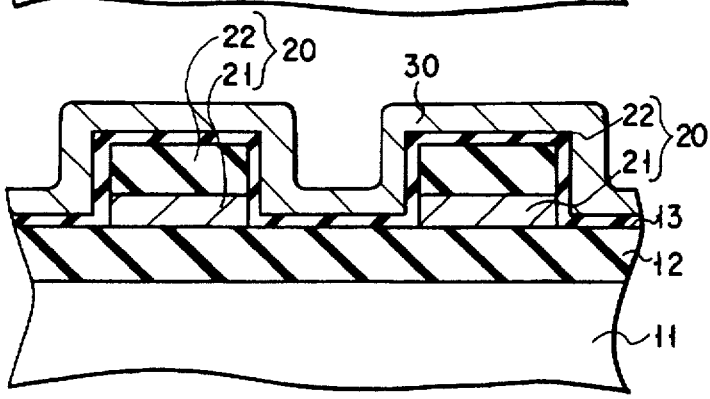
FIG. 7 is a cross sectional view, useful in explaining a process step subsequent to that of FIG. 6.

Further, as is shown in FIG. 7, an anti-fuse insulating film 13 formed of, e.g., a silicon nitride film and having a thickness of about 200Å is deposited on the entire surface of the resultant structure by the plasma CVD method. Thereafter, an Al alloy (Al/Si/Cu) layer of about 6000Å is deposited on the anti-fuse insulating film 13 by sputtering, and then patterned to form a second electrode layer 30.

Figure 8:
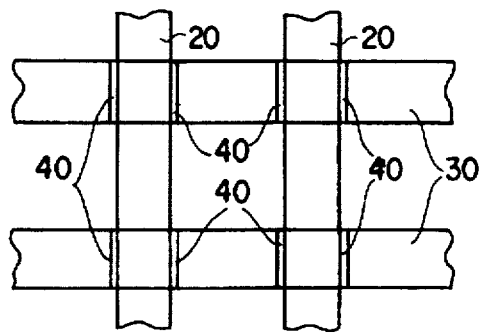
FIG. 8 is a schematic plan view of the structure of FIG. 7.

As is shown in the plan view of FIG. 8, the first and second electrode layers 20 and 30 are formed in a matrix. Anti-fuse elements 40 (indicated by the thick lines) comprise the first and second electrode layers 20 and 30 and the anti-fuse insulating film 13, and are formed on opposite side wall portions of the first electrode layer 20 in a self-alignment manner.

A second embodiment of the anti-fuse element will be explained with reference to FIGS. 9–11. In this case, however, only portions different from those of the first embodiment will be explained.

Figure 9:
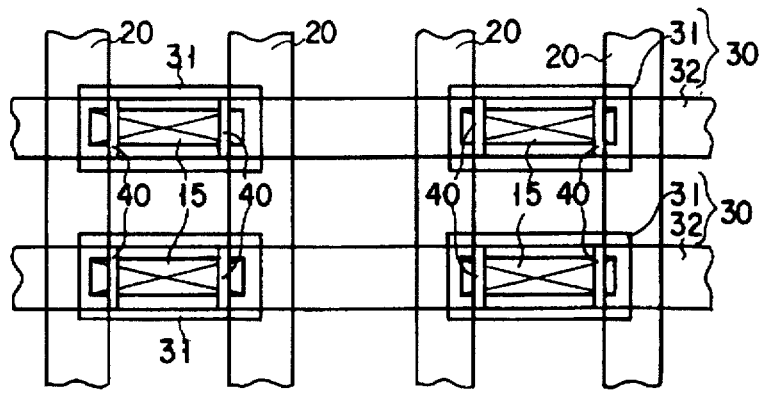
FIG. 9 is a schematic plan view, showing another structure of the anti-fuse element according to the invention.

As is shown in FIG. 9, the first and second electrode layers 20 and 30 are formed in a matrix in the second embodiment, too. However, the second electrode layer 30 comprises a second metal layer 31 and a third metal layer 32 connected to the second metal layer 31 in a contact hole 15. Each anti-fuse element 40 is formed on one of the side wall portions of each first electrode layer 20, i.e., on opposite side wall portions of each adjacent pair of the first electrode layers 20.

A method for manufacturing the semiconductor device with the anti-fuse element shown in FIG. 9 will be explained with reference to FIGS. 10–12.

Figure 10:
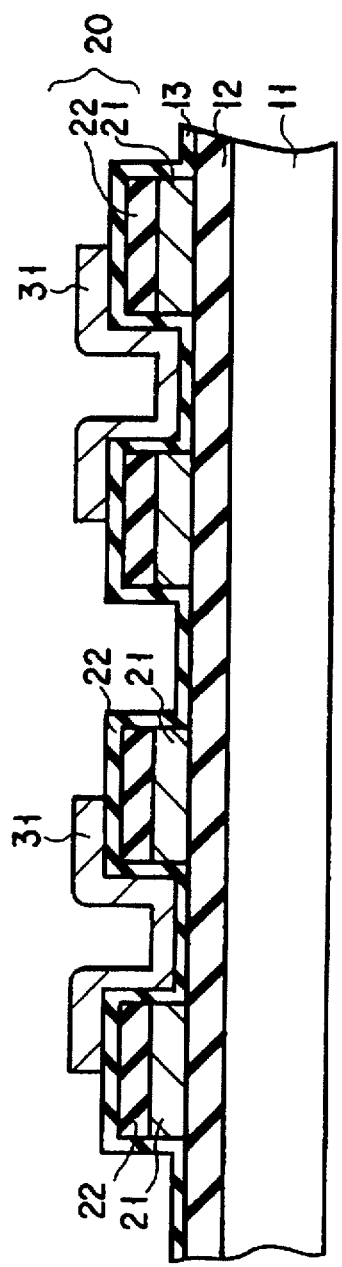
FIG. 10 is a cross sectional view, useful in explaining a process step for forming the anti-fuse element of FIG. 9.

Referring first to FIG. 10, a first electrode layer 20 and an anti-fuse insulating film 13 are formed on a silicon substrate 11, as in the first embodiment. Thereafter, a TiN layer with a thickness of 2000Å is deposited on the insulating film 13 by sputtering, and then patterned such that it remains on upper portions of the insulating film 13 and the portions thereof covering the opposite side wall portions of each adjacent pair of the first electrode layers 20, thereby forming second metal layers 31.

Figure 11:
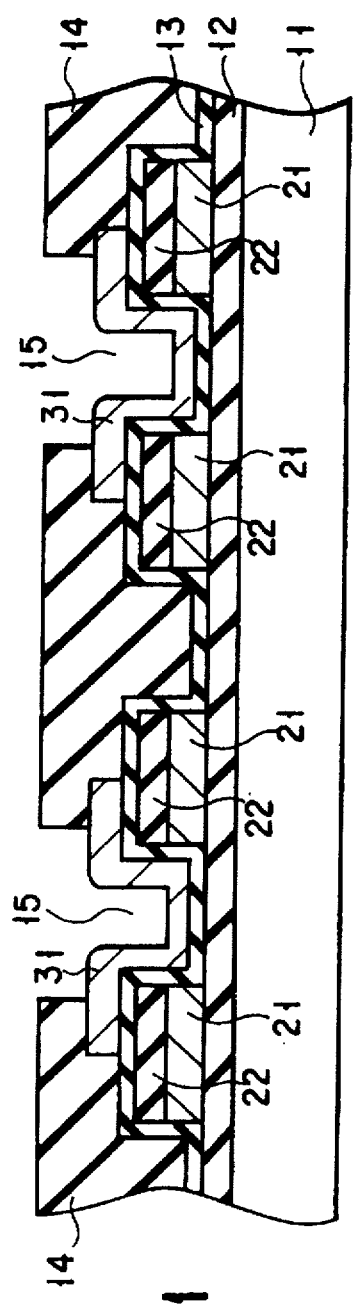
FIG. 11 is a cross sectional view, useful in explaining a process step subsequent to that of FIG. 10.
Figure 12:
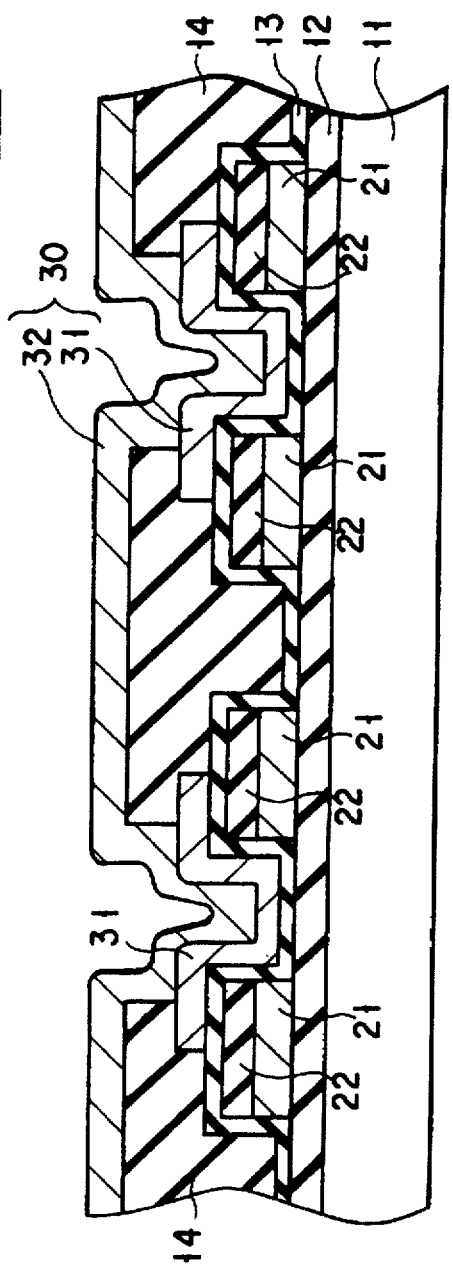
FIG. 12 is a cross sectional view, useful in explaining a process step subsequent to that of FIG. 11.

Subsequently, as is shown in FIG. 11, an interlayer insulating film 14 is formed on the entire surface of the resultant structure, and contact holes 15 are formed in those portions of the interlayer insulating film 14 which are located on the second metal layers 31. Thereafter, a third metal layer 32 of an Al alloy (Al/Si/Cu) is formed. The third metal layer 32 is connected to the second metal layer 31 in the contact hole 15. These metal layers constitute the second electrode layer 30.

Since, in the second embodiment, the anti-fuse element 40 is formed on only one side wall portion of the first electrode layer 20, its capacitance can be reduced to ½ of that in the first embodiment. Accordingly, the anti-fuse element 40 can have higher performance.

In the first and second embodiments, the capacitance of the anti-fuse element can be reduced by making the first metal layer 21 as thin as possible.

As described above, in the first and second embodiments, the anti-fuse elements 40 are formed on side wall portions of the first electrode layer 20, which means that no contact hole is formed in the first electrode layer 20. As a result, the size of the anti-fuse element 40 is not limited to the minimum value required to form the contact hole by lithography. Therefore, the anti-fuse elements 40 can be highly integrated, and can be of a small capacitance.

The material of first and second electrode layers is not limited to an Al alloy or TiN. Each of these layers may be formed of a single layer or a lamination layer which is made of a metal of a high fusing point (such as a doped polysilicon, Ti, W or Mo), or of their compounds or a silicide. Moreover, the first and second electrode layers are not necessarily made of the same material. In addition, the anti-fuse insulating film is not limited to a silicon nitride film, but may be formed of a lamination film or the like, as long as it is dielectric.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an insulating film completely covering said semiconductor substrate;

a first electrode layer formed on said insulating film and covering first regions of said insulating film;

a first insulating layer formed only on said first electrode layer and completely covering said first electrode layer;

an anti-fuse insulating film covering and directly contacting at least two side wall portions of each of said first electrode layer and said first insulating layer, said anti-fuse insulating film completely covering and directly, contacting all second regions of said insulating film wholly outside said first regions covered by said first electrode layer; and a second electrode layer formed on said anti-fuse insulating film.

2. The semiconductor device of claim 1, wherein said semiconductor device includes an anti-fuse element including a junction of said first and second electrode layers and said anti-fuse insulating film.

3. A semiconductor device comprising:

a semiconductor substrate;

an insulating film completely covering said semiconductor substrate:

a first electrode layer group including a plurality of first electrode layers arranged in columns on said insulating film and covering first regions of said insulating film;

a first insulating layer formed only on each of said first electrode layers and completely covering each of said first electrode layers;

an anti-fuse insulating film covering and directly contacting upper portions of said first insulating layers, and at least two side wall portions of said first electrode layers and said first insulating layers, said anti-fuse insulating film completely covering and directly contacting all second regions of said insulating film wholly outside said first regions covered by said first electrode layers: and a second electrode layer group including a plurality of second electrode layers arranged in rows on said anti-fuse insulating film.

4. The semiconductor device of claim 3, wherein said semiconductor device includes an anti-fuse element including a junction of said first and second electrode layers and said anti-fuse insulating film.

5. The semiconductor device of claim 4, wherein said second electrode layer group and said first electrode layer group are arranged in a matrix.

6. The semiconductor device of claim 3, wherein said second electrode layer group and said first electrode layer group are arranged in a matrix.

7. The semiconductor device of claim 6, wherein said semiconductor device includes a plurality of anti-fuse elements each including a junction of said first and second electrode layers and said anti-fuse insulating film.

8. A semiconductor device comprising:

a semiconductor substrate;

an insulating film completely coveting said semiconductor substrate;

a first electrode layer group including a plurality of first electrode layers arranged in columns on said insulating film and covering first regions of said insulating film;

a first insulating layer formed only on each of said first electrode layers and completely covering each of said first electrode layers;

an anti-fuse insulating film coveting and directly contacting upper portions of said first insulating layers, and at least two side wall portions of said first electrode layers and said first insulating layers, said anti-fuse insulating film completely covering and directly contacting all second regions of said insulating film wholly outside said first regions covered by said first electrode layers;

a second electrode layer group including a plurality of second electrode layers arranged in rows on said anti-fuse insulating film;

a second insulating layer formed on said anti-fuse insulating film; and a third electrode layer group including a plurality of third electrode layers arranged in rows on said second insulating layer and said second electrode layers.

9. The semiconductor device of claim 8, wherein said semiconductor device includes an anti-fuse element including a junction of said first and second electrode layers and said anti-fuse insulating film.

10. The semiconductor device of claim 9, wherein said second electrode layer group and said first electrode layer group are arranged in a matrix.

11. The semiconductor device of claim 9, wherein a portion of one of said plurality of second electrode layers connects a pair of anti-fuse elements at opposed side wall portions of an adjacent pair of said first electrode layers.

12. The semiconductor device of claim 11, wherein said second electrode layer group and said first electrode layer group are arranged in a matrix.

13. The semiconductor device of claim 9, wherein each portion of each of said plurality of second electrode layers connects a pair of anti-fuse elements at opposed side wall portions of adjacent pairs of said first electrode layers.

14. The semiconductor device of claim 13, wherein said second electrode layer group and said first electrode layer group are arranged in a matrix.

15. The semiconductor device of claim 8, wherein said second electrode layer group and said first electrode layer group are arranged in a matrix.

16. The semiconductor device of claim 15, wherein said semiconductor device includes a plurality of anti-fuse elements each including a junction of said first and second electrode layers and said anti-fuse insulating film.

17. The semiconductor device of claim 16, wherein each of said plurality of second electrode layers includes a plurality of portions each connecting a pair of anti-fuse elements at opposed side wall portions of adjacent pairs of said first electrode layers.

* * * * *